(12) United States Patent
Jindo et al.

(10) Patent No.: US 9,142,439 B2
(45) Date of Patent: Sep. 22, 2015

(54) LAMINATED STRUCTURE, MEMBER FOR SEMICONDUCTOR MANUFACTURING APPARATUS, AND METHOD FOR PRODUCING LAMINATED STRUCTURE

(71) Applicant: NGK INSULATORS, LTD., Nagoya (JP)

(72) Inventors: Asumi Jindo, Okazaki (JP); Katsuhiro Inoue, Ama-Gun (JP); Yuji Katsuda, Tsushima (JP)

(73) Assignee: NGK Insulators, Ltd., Nagoya (JP)

( * ) Notice: Subject to any disclaimer, the term of this patent is extended or adjusted under 35 U.S.C. 154(b) by 137 days.

(21) Appl. No.: 14/022,629

(22) Filed: Sep. 10, 2013

(65) Prior Publication Data

US 2014/0079946 A1 Mar. 20, 2014

(30) Foreign Application Priority Data

Sep. 14, 2012 (JP) ................. 2012-203586

(51) Int. Cl.
| | |
|---|---|
| H01L 21/683 | (2006.01) |
| B32B 18/00 | (2006.01) |
| H01J 37/32 | (2006.01) |
| C04B 35/58 | (2006.01) |
| C04B 35/581 | (2006.01) |
| C04B 35/645 | (2006.01) |

(52) U.S. Cl.
CPC ............ *H01L 21/6833* (2013.01); *B32B 18/00* (2013.01); *C04B 35/58* (2013.01); *C04B 35/581* (2013.01); *C04B 35/645* (2013.01); *H01J 37/3222* (2013.01); *H01J 37/3255* (2013.01); *H01J 37/32238* (2013.01); *H01J 37/32477* (2013.01); *H01J 37/32715* (2013.01); *C04B 2235/3206* (2013.01); *C04B 2235/3217* (2013.01); *C04B 2235/3222* (2013.01); *C04B 2235/3224* (2013.01); *C04B 2235/3225* (2013.01); *C04B 2235/3865* (2013.01); *C04B 2235/3869* (2013.01); *C04B 2235/72* (2013.01); *C04B 2235/80* (2013.01); *C04B 2235/9607* (2013.01); *C04B 2237/366* (2013.01); *C04B 2237/60* (2013.01); *Y10T 428/265* (2015.01)

(58) Field of Classification Search
None
See application file for complete search history.

(56) References Cited

U.S. PATENT DOCUMENTS

| | | | |
|---|---|---|---|
| 6,447,937 B1 | 9/2002 | Murakawa et al. | |
| 6,607,836 B2 * | 8/2003 | Katsuda et al. | 428/469 |
| 2008/0029032 A1 * | 2/2008 | Sun et al. | 118/728 |
| 2010/0128409 A1 * | 5/2010 | Teratani et al. | 361/234 |

(Continued)

FOREIGN PATENT DOCUMENTS

| | | |
|---|---|---|
| JP | 3559426 B2 | 9/2004 |
| WO | 2012/056875 A1 | 5/2012 |

*Primary Examiner* — David Sample
(74) *Attorney, Agent, or Firm* — Burr & Brown, PLLC

(57) ABSTRACT

A laminated structure 10 includes a first structure 12 containing a main phase of magnesium-aluminum oxynitride, a second structure 14 containing a main phase of aluminum nitride and grain boundary phases of a rare-earth aluminum composite oxide having a garnet-type crystal structure, and a reaction layer 15 formed between the first structure 12 and the second structure 14. The reaction layer 15 is an aluminum nitride layer containing a smaller amount of grain boundary phases 18 of the rare-earth aluminum composite oxide than the second structure 14. The reaction layer 15 of the laminated structure 10 has a thickness of 150 μm or less. The reaction layer 15 is formed during the sintering by diffusing the grain boundary phases 18 into the first structure 12.

16 Claims, 9 Drawing Sheets

(56) References Cited

U.S. PATENT DOCUMENTS

2012/0231243 A1 9/2012 Watanabe et al.
2014/0154465 A1* 6/2014 Sun et al. ..................... 428/137

* cited by examiner

SEM photographs of first structure in Example 1

SEM photographs of first structure in Example 15

LAMINATED STRUCTURE, MEMBER FOR SEMICONDUCTOR MANUFACTURING APPARATUS, AND METHOD FOR PRODUCING LAMINATED STRUCTURE

BACKGROUND OF THE INVENTION

1. Field of the Invention

The present invention relates to a laminated structure, a member for a semiconductor manufacturing apparatus, and a method for producing the laminated structure.

2. Description of the Related Art

Reactive plasma of a halogen, such as F of Cl, for etching or cleaning is used in a semiconductor manufacturing apparatus for use in a dry process or plasma coating in semiconductor manufacturing. Thus, members for use in such a semiconductor manufacturing apparatus require high corrosion resistance and generally include members composed of corrosion-resistant metals, such as aluminum subjected to alumite treatment and Hastelloy, and ceramics. In particular, electrostatic chuck members and heater members for supporting and fixing a Si wafer require high corrosion resistance and low dusting and are therefore made of corrosion-resistant ceramics, such as aluminum nitride, alumina, and sapphire. Even such ceramic materials are gradually corroded in long-term use and generate dust. Thus, there is a demand for higher corrosion-resistant materials. In order to meet such a demand, yttria, which has higher corrosion resistance than alumina, or magnesia or spinal ($MgAl_2O_4$), which have still higher corrosion resistance, or composite materials thereof are being studied as materials (for example, Patent Literature 1).

With a decrease in the width of electric wiring, members for supporting and fixing a Si wafer, such as electrostatic chucks and heaters, require excellent temperature uniformity. In order to improve temperature uniformity, it is desirable to use materials having high thermal conductivity. Among the ceramic materials described above, aluminum nitride has particularly high thermal conductivity and excellent temperature uniformity. Aluminum nitride, however, has lower plasma resistance than yttria and has a problem of contamination of electric wiring with dust. Thus, a laminated structure in which a first structure (a corrosion-resistant layer) and a second structure (a substrate layer) are laminated has been proposed (see, for example, Patent Literature 2). The first structure contains a main phase of corrosion-resistant magnesium-aluminum oxynitride. The second structure contains a main phase of aluminum nitride having high thermal conductivity. The corrosion-resistant first structure and the second structure, which has different characteristics (such as heat conductivity and mechanical strength) from the first structure, in the laminated structure can improve corrosion resistance and other characteristics.

[Patent Literature 1] Japanese Patent No. 3559426
[Patent Literature 2] WO 2012/056875

SUMMARY OF THE INVENTION

In the laminated product described in Patent Literature 2, however, when the corrosion-resistant layer and the substrate layer have very different thicknesses, the laminated product may have defects, such as a crack. Thus, it is desirable that a laminated structure in which a first structure and a second structure are laminated be formed with reduced occurrence of detects.

In view of the situation described above, it is a principal object of the present invention to provide a laminated structure in which a plurality of structures each having a given thickness are stacked and can reduce the occurrence of defects, member for a semiconductor manufacturing apparatus, and a method for producing the laminated structure.

As a result of extensive studies to achieve the principal object, the present inventors completed the present invention by finding that sintering a second structure containing grain boundary phases of a rare-earth aluminum composite oxide having a garnet-type crystal structure ($RE_3Al_5O_{12}$, wherein RE denotes a rare-earth metal element) formed on a first structure containing a main phase of magnesium-aluminum oxynitride while minimizing the difference in linear thermal expansion coefficient between the first structure and the second structure can suppress the formation of a reaction layer containing a smaller amount of grain boundary phases between the first structure and the second structure, thereby reducing the occurrence of defects.

That is, a laminated structure of the present invention includes: a first structure containing a main phase of magnesium-aluminum oxynitride; a second structure containing a main phase of aluminum nitride and grain boundary phases of a rare-earth aluminum composite oxide having a garnet-type crystal structure; and a reaction layer formed between the first structure and the second structure, the reaction layer being an aluminum nitride layer containing a smaller amount of grain boundary phases of the rare-earth aluminum composite oxide than the second structure, wherein the reaction layer has a thickness of 150 μm or less, and the difference in linear thermal expansion coefficient between the first structure and the second structure is 0.3 ppm/K or less.

A member for a semiconductor manufacturing apparatus according to the present invention has the laminated structure described above.

In the present invention, a method for producing a laminated structure in which a first structure and a second structure are laminated, wherein the difference in linear thermal expansion coefficient between the first structure and the second structure is 0.3 ppm/K or less, and the method comprises a forming process of the second structure including applying a raw material powder of the second structure containing a main phase of aluminum nitride and grain boundary phases of a rare-earth aluminum composite oxide having a garnet-type crystal structure to the first structure, which is a sintered body containing magnesium-aluminum oxynitride, to form a laminated product and the laminate product is sintered by hot-pressing.

A laminated structure, a member for a semiconductor manufacturing apparatus, and a method for producing the laminated structure according to the present invention can reduce the occurrence of defects in the laminated structure in which a plurality of structures each having a given thickness are stacked. The reason for this is not clear but may be assumed as described below. For example, when the difference in linear thermal expansion coefficient between the first structure and the second structure is 0.3 ppm/K or less, because of the small difference in linear thermal expansion coefficient between the first structure and the second structure, bonding of the structures at high temperatures for example, bonding by sintering) or repeated use of the laminated structure at high temperature and low temperature rarely causes cracking or detachment. For example, when the first structure containing magnesium-aluminum oxynitride and the second structure containing grain boundary phases of a monoclinic-type rare-earth aluminum composite oxide ($RE_4Al_2O_9$, wherein RE denotes a rare-earth metal element) are laminated and fired, it is supposed that the grain boundary phases of the second structure can easily diffuse into the first structure to form a thicker reaction layer containing a smaller amount of grain boundary phases of the rare-earth aluminum composite oxide. A larger difference in thickness between the first structure and the second structure results in greater stress during the sintering process and a greater number of defects, such as cracks. In contrast, use of the second structure containing grain boundary phases of the garnet-type rare-earth aluminum composite oxide can reduce the diffusion of the grain boundary phases of the second structure into the first structure and thereby reduce the formation of the reaction layer. This can probably reduce the number of defects, such as cracks, in the laminated structure.

DESCRIPTION OF THE PREFERRED EMBODIMENTS

Figure 1:
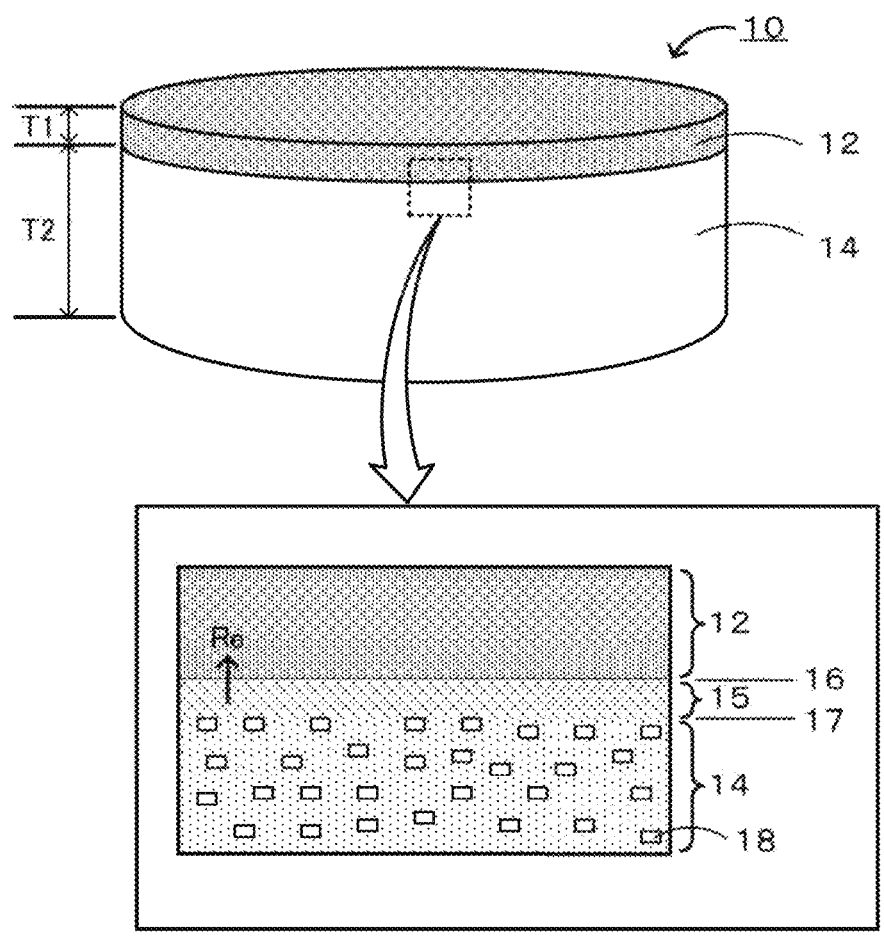
FIG. 1 is a schematic view of a laminated structure 10.

A laminated structure according to the present invention includes a first structure containing a main phase of magnesium-aluminum oxynitride, a second structure containing a main phase of aluminum nitride and grain boundary phases of a rare-earth aluminum composite oxide having a garnet-type crystal structure, and a reaction layer formed between the first structure and the second structure. The reaction layer is an aluminum nitride layer containing a smaller amount of grain boundary phases of the rare-earth aluminum composite oxide than the second structure.

A first structure of the present invention has a magnesium-aluminum oxynitride phase serving as a main phase, wherein an XRD peak of the magnesium-aluminum oxynitride phase measured with CuKα radiation appears at least 2θ=the 47 to 50°. The magnesium-aluminum oxynitride contains magnesium, aluminum, oxygen, and nitrogen as main components. Since the magnesium-aluminum oxynitride has halogen plasma corrosion resistance equal to or higher than spinel, a first structure of the present invention containing the main phase of the oxynitride is considered to have high corrosion resistance. The magnesium-aluminum oxynitride may have substantially the same corrosion resistance as spinel and a smaller linear thermal expansion coefficient than spinel.

A first structure of the present invention may contain a MgO—AlN solid solution crystal phase as a subphase. In the MgO—AlN solid solution, aluminum nitride is dissolved in magnesium oxide. The MgO—AlN solid solution also has high corrosion resistance and can serve as the subphase without problems. The MgO—AlN solid solution may have peaks of a (200) plane and a (220) plane in XRD using a CuKα ray at 2θ in the range of 42.9 to 44.8 degrees and 623 to 652 degrees, respectively, which are between peaks of magnesium oxide cubic crystals and aluminum nitride cubic crystals. The MgO—AlN solid solution may also have an XRD peak of a (111) plane at 2θ in the range of 36.9 to 39 degrees, which is between peaks of magnesium oxide cubic crystals and aluminum nitride cubic crystals. The peak of the (111) plane sometimes cannot be differentiated from peaks of another crystal phase. Thus, only the XRD peaks of the (200) plane and the (220) plane may be observed in these ranges.

A first structure of the present invention may contain a small amount of spinel. This is because spinel has higher corrosion resistance than alumina and AlN crystals. Spinel, however, has lower corrosion resistance than the magnesium-aluminum oxynitride phase and the MgO—AlN solid solution of the present invention and is therefore preferably minimized. The AlN crystal phase is also preferably minimized. This is because the AlN crystal phase as the subphase tends to reduce corrosion resistance. A small amount of spinal or AlN crystal phase may be contained so as to reduce the linear thermal expansion coefficient while maintaining substantially the same corrosion resistance as spinel.

A first structure of the present invention preferably has a raw material composition of 50 mol % or more and 95 mol % or less aluminum nitride, 1 mol % or more and 40 mol % or less magnesium oxide, and 1 mol % or more and 25 mol % or less aluminum oxide. Within these ranges, it is easy to contain magnesium-aluminum oxynitride as a main phase. The aluminum nitride more preferably constitutes 51 mol % or more and 90 mol % or less, still more preferably 53 mol % or more and 89 mol % or less, of the raw material composition. The magnesium oxide more preferably constitutes 3 mol % or more and 35 mol % or less, still more preferably 5 mol % or more and 32 mol % or less, of the raw material composition. The aluminum oxide more preferably constitutes 2 mol % or more and 20 mol % or less, still more preferably 3 mol % or more and 15 mol % or less, of the raw material composition. The magnesium/aluminum molar ratio of the raw material powder is preferably 0.05 or more and 1.50 or less, more preferably 0.10 or more and 1.0 or less. In these ranges, the linear thermal expansion coefficient can be decreased while maintaining substantially the corrosion resistance as spinel.

In a first structure of the present invention, magnesium-aluminum oxynitride in the main phase has a linear thermal expansion coefficient in the range of 5.5 to 7 ppm/K at a temperature in the range of 40° C. to 1000° C. Thus, the ratio between the subphase components MgO—AlN solid solution (12 to 14 ppm/K), spinel (8 to 9 ppm/K), and aluminum nitride (5 to 6 ppm/K) can be changed to control the linear thermal expansion coefficient within the range of 5.5 to 7 ppm/K while maintaining high corrosion resistance. Since spinel and aluminum nitride have lower corrosion resistance than magnesium-aluminum oxynitride and MgO—AlN solid solution, spinel and aluminum nitride are preferably minimized in terms of corrosion resistance. Through such control of the subphase components, the thermal expansion can be adjusted to the thermal expansion of the second structure, or a thermal expansion difference can be reduced. This facilitates lamination or bonding of a plurality of structures; for example, only the surface (the first structure) may be made of a ceramic material having high corrosion resistance, and the underlying substrate (the second structure) may be made of a ceramic maternal having high thermal conductivity. In particular, first of all, such a laminated structure and thermal expansion control are effective in integrated sintering. Among others, use of a material containing a main phase of aluminum nitride in the substrate of the second structure allows high heat conduction to be maintained and the surface temperature of the corrosion-resistant first structure to be uniformly maintained. Such a structure is particularly effective in a semiconductor manufacturing apparatus including a built-in heater.

A first structure of the present invention preferably has an open porosity of 5% or less. The open porosity is measured in accordance with Archimedes' principle using pure water as a medium. An open porosity of more than 5% may result in a decrease in strength, dusting of the material because of falling of grains, or accumulation of a dust component in the pores during material processing. The open porosity is preferably close to zero. Thus, the open porosity has no particular lower limit.

A second structure of the present invention contains a main phase of aluminum nitride and grain boundary phases of a rare-earth aluminum composite oxide having a garnet-type crystal structure. The second structure may further contain a rare-earth aluminum composite oxide having a perovskite-type crystal structure ($REAlO_3$, wherein RE denotes a rare-earth metal element). In this case, the garnet-type rare-earth aluminum composite oxide content is preferably higher than the perovskite-type rare-earth aluminum composite oxide content. This can further reduce the thickness of a reaction layer described below. A second structure of the present invention preferably contains no grain boundary phase of a rare-earth aluminum composite oxide having a monoclinic-type crystal structure. This can further reduce the thickness of the reaction layer. This is because a monoclinic-type rare-earth aluminum composite oxide more easily diffuses into magnesium-aluminum oxynitride of the first structure than the garnet-type.

A second structure of the present invention preferably has an aluminum nitride content of 50% by mass or more and 95% by mass or less, more preferably 60% by mass or more and 90% by mass or less, still more preferably 70% by mass or more and 85% by mass or less, on the basis of XRD quantitative values in which aluminum nitride, a rare-earth aluminum composite oxide, and a rare-earth oxide constitute 100% by mass. The second structure preferably has a garnet-type rare-earth aluminum composite oxide content of 4.0% by mass or more and 36.2% by mass or less, more preferably 10% by mass or more, still more preferably 15% by mass or more, on the basis of the XRD quantitative values. The second structure preferably has a perovskite-type rare-earth aluminum composite oxide content of 5% by mass or less, more preferably 4% by mass or less, still more preferably 3% by mass or less, on the basis of the XRD quantitative values. The second structure preferably has higher thermal conductivity as the aluminum nitride content increases. The amount of rare-earth aluminum composite oxide can be controlled to reduce the difference in linear thermal expansion coefficient from the first structure. A simplified profile fitting function (FPM Eval.) of powder diffraction data analysis software "EVA" available from Bruker AXS K.K. is used for the XRD quantitative determination. This function calculates the quantitative ratio of constituent phases using I/Icor (an intensity ratio relative to the diffraction intensity of corundum) of an ICDD PDF card of an identified crystal phase. The function allows ICDD PDF cards of constituent phases No. 00-025-1133 (AlN), No. 00-055-1088 ($M(Y4Al2O9)$), No. 01-070-7794 ($G(Y3Al5O12)$), and No. 01-070-1677 ($P(YAlO3)$) to be used at $2\theta$ in the range of 10 to 60 degrees in analysis.

A second structure of the present invention preferably has a raw material composition of 84 mol % or more and 99 mol % or less aluminum nitride, 0.5 mol % or more and 13 mol % or less aluminum oxide, and 0.5 mol % or more and 10 mol % or less rare-earth oxide. Within these ranges, it is easy to contain aluminum nitride as a main phase. The aluminum nitride more preferably constitutes 85 mol % or more and 98 mol % or less, still more preferably 86 mol % or more and 97 mol % or less, of the raw material composition. The aluminum oxide more preferably constitutes 1 mol % or more and 11 mol % or less, still more preferably 1 mol % or more and 9 mol % or less, of the raw material composition. The rare-earth oxide more preferably constitutes 1 mol % or more and 8 mol % or less, still more preferably 1 mol % or more and 6 mol % or less, of the raw material composition.

A second structure of the present invention is made of aluminum nitride, a rare-earth oxide, and aluminum oxide. The ratio ($R/(R+A)$) of the number of moles of rare-earth oxide R to the total number of moles of rare-earth oxide and aluminum oxide ($R+A$) of the raw material composition is preferably 0.70 or less, wherein R denotes the number of moles of rare-earth oxide, and A denotes the number of moles of aluminum oxide. Within this range, the ratio of the perovskite-type rare-earth aluminum composite oxide to the garnet-type rare-earth aluminum composite oxide in grain boundary phases is small, and the thickness of the reaction layer can be reduced. The ratio ($R/(R+A)$) is more preferably 0.38 or more and 0.60 or less, still more preferably 0.39 or more and 0.55 or less.

In a second structure of the present invention, the rare-earth element RE of the rare-earth aluminum composite oxide is preferably at least one of Y, Dy, Ho, Er, Tm, Yb, and Lu, more preferably Y. This is because these rare-earth elements RE can easily form a garnet-type rare-earth aluminum composite oxide.

A reaction layer of the present invention is formed between the first structure and the second structure and is an aluminum nitride layer containing a smaller amount of grain boundary phases of a rare-earth aluminum composite oxide than the second structure in the laminated structure, while the second structure is fired, grain boundary phases containing the rare-earth aluminum composite oxide of the second structure diffuse into the first structure to form a secondary interface containing low density of grain boundary phases. The reaction layer is a layer containing a smaller amount of grain boundary phases formed between an initial interface between the first structure and the second structure and the secondary interface. The reaction layer is identified by cross-sectional observation with an electron microscope (SEM) and elementary analysis. The reaction layer is mainly composed of aluminum nitride and may contain crystal phases (corresponding to grain boundary phases) of other than aluminum nitride. A reaction layer of the present invention has a thickness of 150 µm or less, preferably 100 µm or less, more preferably 75 µm or less. The reaction layer having a thickness of 150 µm or less can reduce the occurrence of detects (such as cracking and detachment) between the first structure and the second structure. Although the occurrence of defects cannot be prevented only by the thickness of the reaction layer, the thickness Of the reaction layer is preferably reduced to prevent the occurrence of defects.

In a laminated structure according to the present invention, the difference in linear thermal expansion coefficient between the first structure and the second structure is 0.3 ppm/K or less. When the difference in linear thermal expansion coefficient is 0.3 ppm/K or less, the occurrence of defects (such as cracking and detachment) between the first structure and the second structure can be reduced. Although the occurrence of defects cannot be prevented only by the difference in linear thermal expansion coefficient, the difference in linear thermal expansion coefficient closer to "0", most preferably of 0, results in a reduced number of occurrences of defects.

In a laminated structure according to the present invention, the thickness T2 of the second Structure is preferably greater than the thickness T1 of the first structure. In accordance with the present invention, irrespective of the thicknesses of the first structure and the second structure, the occurrence of defects (such as cracking and detachment) in the laminated structure can be reduced. Thus, the first structure and the second structure may have any thickness. In a laminated structure according to the present invention, the ratio (T2/T1) of the thickness T2 of the second structure to the thickness T1 of the first structure is preferably 1 or more, more preferably 2 or more, still more preferably 3 or more. A laminated structure in which a plurality of structures is stacked tends to have defects at T2/T1 of 1 or more. Thus, the present invention has advantages at T2/T1 of 1 or more.

A laminated structure according to the present invention can be used in members for a semiconductor manufacturing apparatus. A member for a semiconductor manufacturing apparatus according to the present invention has one of the laminated structures described above. Examples of the members for a semiconductor manufacturing apparatus include electrostatic chucks, susceptors, heaters, plates, inner wall materials, monitoring windows, microwave entrance windows, and microwave coupling antennas for use in semiconductor manufacturing apparatuses. These members require high corrosion resistance to plasma of a corrosive gas containing a halogen element. Thus, a laminated structure according to the present invention is suitable for these members. The present invention can improve corrosion resistance and heat conductivity and is therefore particularly suitably applied to heaters.

A laminated structure according to the present invention will be described below with reference to the drawings. FIG. 1 is a schematic view of a laminated structure 10 according to the present invention. A lower portion of FIG. 1 is a cross section enlarged view of the laminated structure 10. The laminated structure 10 includes a first structure 12 containing a main phase of magnesium-aluminum oxynitride, a second structure 14 containing a main phase of aluminum nitride and grain boundary phases 18 of a rare-earth aluminum composite oxide having a garnet type crystal structure, and a reaction layer 15 formed between the first structure 12 and the second structure 14 and mainly containing aluminum nitride containing a smaller amount of grain boundary phases 18 of the rare-earth aluminum composite oxide than the second structure. In the laminated structure 10, while the second structure 14 is fired, the grain boundary phases 18 containing the rare-earth aluminum composite oxide of the second structure 14 diffuse into the first structure 12 to form a secondary interface 17 containing a smaller amount of grain boundary phases 18 (see the enlarged view in FIG. 1). The reaction layer 15 is a layer containing a smaller amount of grain boundary phases 18 formed between an initial interface 16 and the secondary interface 17. In the laminated structure 10, the reaction layer 15 has a thickness of 150 μm or less, preferably 100 μm or less, more preferably 75 μm or less. The difference in linear thermal expansion coefficient between the first structure 12 and the second structure 14 of the laminated structure 10 is 0.3 ppm/K or less.

A method for producing a laminated structure according to the present invention will be described below. For example, the production method may include a forming process of a first structure for forming a first structure and a forming process of a second structure for forming a second structure on the formed first structure.

In the forming process of the first structure, a raw material powder for magnesium-aluminum oxynitride of the first structure is shaped, and the shaped compact is subjected to hot-press sintering. In this process, aluminum nitride, magnesium oxide, and aluminum oxide can be used as raw materials. For example, the raw material composition preferably contains 50 mol % or more and 95 mol % or less aluminum nitride, 1 mol % or more and 40 mol % or less magnesium oxide, and 1 mol % or more and 25 mol % or less aluminum oxide. Within these ranges, it is easy to contain magnesium-aluminum oxynitride as a main phase. The aluminum nitride more preferably constitutes 51 mol % or more and 90 mol % or less, still more preferably 53 mol % or more and 89 mol % or less, of the raw material composition. The magnesium oxide more preferably constitutes 3 mol % or more and 35 mol % or less, still more preferably 5 mol % or more and 32 mol % or less, of the raw material composition. The aluminum oxide more preferably constitutes 2 mol % or more and 20 mol % or less, still more preferably 3 mol % or more and 15 mol % or less, of the raw material composition. The magnesium/aluminum molar ratio of the raw material powder is preferably 0.05 or more and 1.50 or less, more preferably 0.10 or more and 1.0 or less. In these ranges, the linear thermal expansion coefficient can be decreased while maintaining substantially the same corrosion resistance as spinel.

In the forming process of the first structure, the raw material powder of the first structure is shaped by a known method. For example, the raw material powder may be shaped by uniaxial pressing or uniaxial pressing and subsequent CIP forming. Alternatively, a slurry of the raw material powder may be prepared and casted to form a compact. A binder to be added to the compact is preferably thermally degradable. The shaping pressure is not particularly limited and may be appropriately determined so as to achieve desired mechanical strength and shape. The hot-press sintering is preferably performed at a temperature of 1850° C. or more and 2000° C. or less, for example. A dense (an open porosity of 0.5% or less) intended magnesium-aluminum oxynitride crystal phase can be obtained at a sintering temperature of 1850° C. or more. The pressing pressure in hot-press sintering is preferably in the range of 50 to 300 kgf/cm$^2$. The sintering atmosphere preferably does not affect the sintering of oxide raw materials and is preferably an inert atmosphere, such as a nitrogen atmosphere or an argon atmosphere. In this manner, a sintered body of the first structure is prepared.

In the forming process of the second structure, a raw material powder Of the second structure containing a main phase of aluminum nitride and grain boundary phases of a rare-earth aluminum composite oxide having a garnet-type crystal structure is formed on the first structure as the sintered body containing magnesium-aluminum oxynitride and is subjected to hot-press sintering. The raw materials of the second structure are formulated such that the difference in linear thermal expansion coefficient between the first structure and the second structure after sintering is 0.3 ppm/K or less. In this process, aluminum nitride, a rare-earth oxide, and aluminum oxide can be used as raw materials. The oxide components may be precursor raw materials that can form the oxides by heating during the sintering process. For example, the raw material composition preferably contains 84 mol % or more and 99 mol % or less aluminum nitride, 0.5 mol % or more and 13 mol % or less aluminum oxide, and 0.5 mol % or more and 10 mol % or less rare-earth oxide. Within these ranges, it is easy to contain aluminum nitride as a main phase. The aluminum nitride more preferably constitutes 85 mol % or more and 98 mol % or less, still more preferably 86 mol % or more and 97 mol % or less, of the raw material composition. The aluminum oxide more preferably constitutes 1 mol % or more and 11 mol % or less, still more preferably 1 mol % or more and 9 mol % or less, of the raw material composition. The rare-earth oxide more preferably constitutes 1 mol % or more and 8 mol % or less, still more preferably 1 mol % or more and 6 mol % or less, of the raw material composition. The rare-earth element of the second structure raw materials is preferably at least one of Y, Dy, Ho, Er, Tm, Yb, and Lu, more preferably Y.

The ratio R/(R+A)) of the number of moles of rare-earth oxide R to the total number of moles of rare-earth oxide and aluminum oxide (R+A) of the raw material composition of the second structure is preferably 0.70 or less, wherein R denotes the number of moles of rare-earth oxide, and A denotes the number of moles of aluminum oxide. Within this range, the ratio of the perovskite-type rare-earth aluminum composite oxide to the garnet-type rare-earth aluminum composite oxide in grain boundary phases is small, and the thickness of the reaction layer can be reduced. The ratio (R/(R+A)) is more preferably 0.38 or more and 0.60 or less, still more preferably 0.39 or more and 0.55 or less.

In the forming process of the second structure, the raw material powder of the second structure is applied to the sintered body as the first structure. For example, the raw material powder of the second structure may be shaped and bonded to the sintered body as the first structure, or the raw material powder of the second structure may be directly placed on the sintered body of the first structure and subjected to press forming. As in the first structure, the second structure may be formed by shaping the raw material powder by uniaxial pressing or uniaxial pressing and subsequent CIP forming. Alternatively, a slurry of the raw material powder may be prepared and casted to form a compact. The first structure and the second structure may be stacked while pressing against the first structure. The shaping pressure is not particularly limited and may be appropriately determined so as to achieve desired mechanical strength and shape.

In the forming process of the second structure, the hot-press sintering is preferably performed at a temperature of more than 1650° C. and less than 1850° C., for example. An intended dense second structure containing rare-earth aluminum composite oxide integrated with the first structure can be obtained at a sintering temperature of more than 1650° C. Furthermore, the thickness of the reaction layer at an interface between the first structure and the second structure can be reduced at a sintering temperature of less than 1850° C. In order to obtain a dense (an open porosity of 0.5% or less) second structure, the sintering temperature is preferably 1675° C. or more, more preferably 1700° C. or more. In order to reduce the formation of the interfacial reaction layer, the sintering temperature is preferably 1825° C. or less, more preferably 1800° C. or less. The pressing pressure in hot-press sintering is preferably in the range of 50 to 300 kgf/cm$^2$. The sintering atmosphere preferably does not affect the sintering of oxide raw materials and is preferably an inert atmosphere, such as a nitrogen atmosphere or an argon atmosphere. In this manner, a sintered body of a laminated structure in which the first structure and the second structure are stacked can be produced.

The laminated structures, the members for a semiconductor manufacturing apparatus, and the methods for producing the laminated structures according to embodiments of the present invention described above can reduce the occurrence of defects in the laminated structure in which a plurality of structures each having a given thickness are stacked. This is because when the difference in linear thermal expansion coefficient between the first structure and the second structure is 0.3 ppm/K or less, because of the small difference in linear thermal expansion coefficient between the first structure and the second structure, bonding of the structures at high temperatures (for example, bonding by sintering) or repeated use of the laminated structure at high temperature and low temperature rarely causes cracking or detachment. Furthermore, for example, when the first structure containing magnesium-aluminum oxynitride and the second structure containing grain boundary phases of the garnet-type rare-earth aluminum composite oxide are stacked and fired, this can reduce the grain boundary phases of the second structure diffusing into the first structure and reduce the formation of the reaction layer. This can reduce defects, such as cracking and detachment, in the laminated structure.

The present invention is not limited to the above-described embodiment. It is clear that the present invention can be implemented in a variety of embodiments without departing from the technical scope thereof.

For example, although the method for producing the laminated structure includes the forming process of the first structure in the embodiments described above, the method for producing the laminated structure is not limited to this. If the sintered body as the first structure is separately prepared, the forming process of the first structure may be omitted.

Although the first structure and the second structure are stacked to form the laminated structure in the embodiments described above, three or more layers may be stacked. Even in such cases, a laminated product of a plurality of structures each having a given thickness that includes at least the first structure and the second structure can reduce the occurrence of defects.

EXAMPLES

Specific examples of the production of a laminated structure will be described in the following examples.

(Forming Process of First Structure)

An AlN raw material, a MgO raw material, and an Al$_2$O$_3$ raw material were weighed so as to satisfy the mol % values listed in Table 1 and were wet-blended in an isopropyl alcohol solvent in a nylon pot using iron-core nylon balls having a diameter of 20 mm for four hours. The AlN raw material, the MgO raw material, and the Al$_2$O$_3$ raw material were commercial products each having a purity of 99.9% by mass or more and an average particle size of 1 μm or less. Since the AlN raw material inevitably contains 1% by mass oxygen, oxygen was not counted as an impurity element to determine the purity. After blending, the resulting slurry was removed and was dried in a nitrogen stream at 110° C. The dried product was passed through a 30-mesh sieve to prepare a mixed powder of the first structure. The mixed powder was subjected to uniaxial pressing at a pressure of 100 kgf/cm$^2$ to form a disc-shaped compact. The disc-shaped compact was placed in a graphite mold for sintering. The disc-shaped compact was subjected to hot-press sintering and was processed into a disc-shaped first structure having a diameter of 50 mm and a thickness of 10 mm. The hot-press sintering was performed at a pressing pressure of 200 kgf/cm$^2$ at a sintering temperature (maximum temperature) listed in Table 1 in a nitrogen atmosphere to the completion of sintering. The holding time at the sintering temperature was four hours.

(Forming Process of Second Structure)

An AlN raw material, an Y$_2$O$_3$ raw material, and an Al$_2$O$_3$ raw material were weighed so as to satisfy the mol % values listed in Table 1 and were wet-blended in an isopropyl alcohol solvent in a nylon pot using iron-core nylon balls having a diameter of 20 mm for four hours. The AlN raw material and the Al$_2$O$_3$ raw material were the same as those of the first structure. The Y$_2$O$_3$ raw material was a commercial product having a purity of 99.9% or more and an average particle size of 1 µm or less. After blending, the resulting slurry was removed and was dried in a nitrogen stream at 110° C. The dried product was passed through a 30-mesh sieve to prepare a mixed powder of the second structure. The mixed powder of the second structure was charged into a cylindrical metal mold and was subjected to uniaxial pressing at a pressure of 200 kgf/cm² to form a disc-shaped compact of the second structure. The compact of the second structure was stacked on the first structure to form a laminated product. The laminated product a placed in a graphite mold for sintering and was subjected to hot-press sintering, thus yielding an integrally sintered laminated structure. The hot-press sintering was performed at a pressing pressure of 200 kgf/cm² at a sintering temperature of the laminated structure listed in Table 1 in a nitrogen atmosphere to the completion of sintering. The holding time at the sintering temperature of the laminated structure was four hours. The resulting sintered body can include an upper portion having a corrosion-resistant surface containing a main phase of magnesium-aluminum oxynitride and a lower portion composed of a heat-conductive substrate containing a main phase of aluminum nitride and containing a rare-earth aluminum composite oxide. The second structure had a thickness of 17 mm.

Comparative Examples 1 and 2

The first structure was formed by mixing 80.3 mol % AlN raw material, 10 mol % MgO raw material, and 8.8 mol % $Al_2O_3$ raw material and sintering at a temperature of 1950° C. The second structure was formed by mixing 97.8 mol % AlN raw material, 2.2 mol % $Y_2O_3$ raw material, and 0 mol % $Al_2O_3$ raw material and sintering at a temperature of 1800° C. The resulting laminated structure was referred to as Comparative Example 1. A laminated structure according to Comparative Example 2 was formed in the same manner as in Comparative Example 1 except that 89.9 mol % AlN raw material, 10.1. mol % $Y_2O_3$ raw material, and 0 mol % $Al_2O_3$ raw material were mixed to form the second structure. In Comparative Examples 1 and 2, the ratio (R/(R+A)) of the number of moles R of rare-earth oxide to the total number of moles (R+A) of rare-earth oxide and aluminum oxide was 1.00. Table 1 lists the conditions for the formation. Of each laminated structure.

TABLE 1

| | First structure | | | | | | | Second structure | | | | |
|---|---|---|---|---|---|---|---|---|---|---|---|---|
| | Raw material composition (mol %) | | | | Sintering temperature | Constituent Phase[1] | | Linear thermal expansion coefficient | Raw material composition (mol %) | | | Sintering temperature of laminated |
| | AlN | MgO | $Al_2O_3$ | Mg/Al | (° C.) | Main phase | Subphase | (ppm/K) | AlN | $Y_2O_3$ (R) | $Al_2O_3$ (A) | R/ (R+A)[2] | structure (° C.) |
| Comparative example 1 | 80.3 | 10.9 | 8.8 | 0.11 | 1950 | Mg—Al—O—N* | — | 5.9 | 97.8 | 2.2 | 0 | 1.00 | 1800 |
| Comparative example 2 | 80.3 | 10.9 | 8.8 | 0.11 | 1950 | Mg—Al—O—N* | — | 5.9 | 89.9 | 10.1 | 0 | 1.00 | 1800 |
| Example 1 | 80.3 | 10.9 | 8.8 | 0.11 | 1950 | Mg—Al—O—N* | — | 5.9 | 93.5 | 2.7 | 3.8 | 0.41 | 1700 |
| Example 2 | 80.3 | 10.9 | 8.8 | 0.11 | 1950 | Mg—Al—O—N* | — | 5.9 | 93.5 | 2.7 | 3.8 | 0.41 | 1750 |
| Example 3 | 80.3 | 10.9 | 8.8 | 0.11 | 1950 | Mg—Al—O—N* | — | 5.9 | 93.5 | 2.7 | 3.8 | 0.41 | 1800 |
| Comparative example 3 | 80.3 | 10.9 | 8.8 | 0.11 | 1950 | Mg—Al—O—N* | — | 5.9 | 93.5 | 2.7 | 3.8 | 0.41 | 1850 |
| Comparative example 4 | 80.3 | 10.9 | 8.8 | 0.11 | 1950 | Mg—Al—O—N* | — | 5.9 | 93.5 | 2.7 | 3.8 | 0.41 | 1900 |
| Example 4 | 80.3 | 10.9 | 8.8 | 0.11 | 1950 | Mg—Al—O—N* | — | 5.9 | 98.8 | 0.7 | 0.5 | 0.60 | 1800 |
| Example 5 | 80.3 | 10.9 | 8.8 | 0.11 | 1950 | Mg—Al—O—N* | — | 5.9 | 96.9 | 1.7 | 1.4 | 0.55 | 1800 |
| Example 6 | 80.3 | 10.9 | 8.8 | 0.11 | 1950 | Mg—Al—O—N* | — | 5.9 | 97.0 | 1.5 | 1.5 | 0.50 | 1800 |
| Example 7 | 80.3 | 10.9 | 8.8 | 0.11 | 1950 | Mg—Al—O—N* | — | 5.9 | 95.4 | 2.0 | 2.6 | 0.43 | 1800 |
| Example 8 | 80.3 | 10.9 | 8.8 | 0.11 | 1950 | Mg—Al—O—N* | — | 5.9 | 92.1 | 3.2 | 4.7 | 0.41 | 1800 |
| Comparative example 5 | 80.3 | 10.9 | 8.8 | 0.11 | 1950 | Mg—Al—O—N* | — | 5.9 | 86.7 | 5.2 | 8.1 | 0.39 | 1800 |
| Example 9 | 88.8 | 5.3 | 5.9 | 0.05 | 1950 | Mg—Al—O—N* | AlN | 5.7 | 96.7 | 1.5 | 1.8 | 0.46 | 1700 |
| Example 10 | 88.8 | 5.3 | 5.9 | 0.05 | 1950 | Mg—Al—O—N* | AlN | 5.7 | 96.7 | 1.5 | 1.8 | 0.46 | 1800 |
| Example 11 | 73.6 | 18.3 | 8.1 | 0.20 | 1950 | Mg—Al—O—N* | — | 6.2 | 92.1 | 3.2 | 4.7 | 0.41 | 1700 |
| Example 12 | 73.6 | 18.3 | 8.1 | 0.20 | 1950 | Mg—Al—O—N* | — | 6.2 | 92.1 | 3.2 | 4.7 | 0.41 | 1800 |
| Example 13 | 74.7 | 21.2 | 4.1 | 0.26 | 1950 | Mg—Al—O—N* | MgOss, AlN | 6.5 | 86.7 | 5.2 | 8.1 | 0.39 | 1700 |
| Example 14 | 74.7 | 21.2 | 4.1 | 0.26 | 1950 | Mg—Al—O—N* | MgOss, AlN | 6.5 | 86.7 | 5.2 | 8.1 | 0.39 | 1800 |
| Example 15 | 54.0 | 31.5 | 14.5 | 0.38 | 1950 | Mg—Al—O—N* | MgAl2O4 | 6.8 | 86.7 | 5.2 | 8.1 | 0.39 | 1700 |
| Example 16 | 54.0 | 31.5 | 14.5 | 0.38 | 1950 | Mg—Al—O—N* | MgAl2O4 | 6.8 | 86.7 | 5.2 | 8.1 | 0.39 | 1800 |

[1]Including a mixture of multiple types of Mg—Al—O—N having different component ratios Subphase: detected phase other than Mg—Al—O—N MgOss: MgO—AlN solid solution
[2]The ratio of the number of moles R of rare-earth oxide to the total number of moles (R + A) of rare-earth oxide and aluminum oxide Examples 1 to 3

The first structure was formed by mixing 80.3 mol % AlN raw material, 10.9 mol % MgO raw material, and 8.8 mol % $Al_2O_3$ raw material and sintering at a temperature of 1950° C. The second structure was formed by mixing 93.5 mol % AlN raw material, 2.7 mol % $Y_2O_3$ raw material, and 3.8 mol % $Al_2O$ raw material and sintering at a temperature of 1700° C. The resulting laminated structure was referred to as Example 1. Laminated structures according to Examples 2 and 3 were formed in the same manner as in Example 1 except that the sintering temperatures of the laminated products were 1750° C. and 1800° C., respectively.

Comparative Examples 3 and 4

A laminated structure according to Comparative Example 3 was formed in the same manner as in Example 1 except that the sintering temperature of the laminated product was 1850° C. A laminated structure according to Comparative Example 4 was formed in the same manner as in Example 1 except that the sintering temperature of the laminated product was 1900° C. The ratio (R/(R+A)) in Examples 1 to 3 and Comparative Examples 3 and 4 was 0.41. Examples 1 to 3 and Comparative Examples 3 and 4 were studied for the sintering temperature of the second structure.

Examples 4 to 8

A laminated structure according to Example 4 was formed in the same manner as in Example 1 except that 98.8 mol %. AlN raw material, 0.7 mol % $Y_2O_3$ raw material, and 0.5 mol % $Al_2O_3$ raw material were mixed and fired at a sintering temperature of 1800° C. to form the second structure. A laminated structure according to Example 5 was formed in the same manner as in Example 4 except that 96.9 mol % $Al_2O_3$ raw material, 1.7 mol % $Y_2O_3$ raw material, and 1.4 mol % $Al_2O_3$ raw material were mixed to form the second structure. A laminated structure according to Example 6 was formed in the same manner as in Example 4 except that 97.0 mol % AlN raw material, 1.5 mol % $Y_2O_3$ raw material, and 1.5 mol % $Al_2O_3$ raw material were mixed to form the second structure. A laminated structure according to Example 7 was formed in the same manner as in Example 4 except that 95.4 mol % AlN raw material, 2.0 mol % $Y_2O_3$ raw material, and 2.6 mol % $Al_2O_3$ raw material were mixed to form the second structure. A laminated structure according to Example 8 was formed in the same manner as in Example 4 except that 92.1 mol % AlN raw material, 3.2 mol % $Y_2O_3$ raw material, and 4.7 mol % $Al_2O_3$ raw material were mixed to form the second structure. The ratios (R/(R+A)) in Examples 4 to 8 were 0.60, 0.55, 0.50, 0.43 and 0.41, respectively.

Comparative Example 5

A laminated structure according to Comparative Example 5 was formed in the same manner as in Example 4 except that 86.7 mol % AlN raw material, 5.2 mol % $Y_2O_3$ raw material, and 8.1 mol % $Al_2O_3$ raw material were mixed to form the second structure.

Examples 9 and 10

The first structure was formed by mixing 88.8 mol % AlN raw material, 5.3 mol % MgO raw material, and 5.9 mol % $Al_2O_3$ raw material and sintering at a temperature of 1950° C. The second structure was formed by mixing 96.7 mol % AlN raw material, 1.5 mol % $Y_2O_3$ raw material, and 1.8 mol % $Al_2O_3$ raw material and sintering at a temperature of 1700° C. The resulting laminated structure was referred to as Example 9. A laminated structure according to Example 10 was formed in the same manner as in Example 9 except that the sintering temperature of the laminated product was 1800° C.

Examples 11 and 12

The first structure was formed by mixing 73.6 mol % AlN raw material, 18.3 mol % MgO raw material, and 8.1 mol % $Al_2O_3$ raw material and sintering at a temperature of 1950° C. The second structure was formed by mixing 92.1 mol % AlN raw material, 3.2 mol % $Y_2O_3$ raw material, and 4.7 mol % $Al_2O_3$ raw material and sintering at a temperature of 1700° C. The resulting laminated structure was referred to as Example 11. A laminated structure according to Example 12 was formed in the same manner as in Example 11 except that the sintering temperature of the laminated product was 1800° C.

Examples 13 and 14

The first structure was formed by mixing 74.7 mol % AlN raw material, 21.2 mol % MgO raw material, and 4.1 mol % $Al_2O_3$ raw material and sintering at a temperature of 1950° C. The second structure was formed by mixing 86.7 mol % AlN raw material, 5.2 mol % $Y_2O_3$ raw material, and 8.1 mol % $Al_2O_3$ raw material and sintering at a temperature of 1700° C. The resulting laminated structure was referred to as Example 13. A laminated structure according to Example 14 was formed in the same manner as in Example 13 except that the sintering temperature of the laminated product was 1800° C.

Example 15 and 16

The first structure was formed by mixing 54.0 mol % AlN raw material, 31.5 mol % MgO raw material, and 14.5 mol % $Al_2O_3$ raw material and sintering at a temperature of 1950° C. The second structure was formed by mixing 86.7 mol % AlN raw material, 5.2 mol % $Y_2O_3$ raw material, and 8.1 mol % $Al_2O_3$ raw material and sintering at a temperature of 1700° C. The resulting laminated structure was referred to as Example 15. A laminated structure according to Example 16 as formed in the same manner as in Example 15 except that the sintering temperature of the laminated product was 1800° C.

[Density and Open Porosity]
Measurement was performed in accordance with Archimedes' principle using pure water as a medium.

[Determination of Crystal Phases and the Semi-Quantitative Analysis by X-Ray Diffractometer]
A portion distant from the reaction layer between the first structure and the second structure was ground in a mortar. The crystal phase was identified with an X-ray diffractometer (D8 Advance manufactured by Bruker AXS K.K.). The measurement conditions included CuKα, 40 kV, 40 mA, and 2θ=5 to 70 degrees. Si was added as a standard substance to samples except for the determination of the second structure of Comparative Example 1. The amounts of crystal phases in the second structure were semi-quantitatively analyzed on the basis of X-ray diffraction peaks. In this example, the AlN content, the monoclinic-type rare-earth aluminum composite oxide (M) content, the garnet-type rare-earth aluminum composite oxide (G) content, the perovskite-type rare-earth aluminum composite oxide (P) content, and the other rare-earth oxide ($RE_2O_3$) content were measured by a simplified profile fitting function (PPM Eval.) of powder diffraction data analysis software "EVA" available from Bruker AXS K.K. This function calculates the quantitative ratio of constituent phases using I/Icor (an intensity ratio relative to the diffraction intensity of corundum) of an ICDD PDF card of an identified crystal phase. The function allowed ICDD PDF cards of constituent phases No. 00-025-1133 (AlN), No. 00-055-1088 (M($Y_4Al_2O_9$)), No. 01-070-7794 (G($Y_3Al_5O_{12}$)), and No. 01-070-1677 (P($YAlO_3$)) to be used at 2θ in the range of 10 to 60 degrees in analysis.

[Crack Check]
The appearance of the laminated structure thus formed was observed to check for a crack at the interfaces and on the top and bottom surfaces. In the crack check, the outer surface of the laminated structure was permeated with a commercially available fluorescence flaw detection liquid, was irradiated with black light (ultraviolet light), and was visually inspected for a crack.

[SEM Observation and Measurement of Thickness of Reaction Layer]

The laminated structure thus formed was observed with a SEM. In the SEM observation, a backscattered electron image of a cross section including a bonded portion between the first structure and the second structure was observed with an electron microscope (SEM, XL30 manufactured by Royal Philips Electronics). SEM photographs were taken at an accelerating voltage of 20 kV at a spot size of 4. An initial interface between the first structure and the second structure and a secondary interface into which rare-earth grain boundary phase diffused from the second structure were identified on the basis of microstructure measurement results and SEM-EDS composition analysis results. A layer between the initial interface and the secondary interface was considered to be a reaction layer. The thickness of the reaction layer was measured using a SEM scale. The initial interface and the secondary interface were distinguishable by the contrast of the photographs.

[Average Linear Thermal Expansion Coefficient (40° C. to 1000° C.)]

Measurement was performed with a thermal dilatometer (TD5000S Manufactured by Mac Science Co., Ltd.) in an Argon Atmosphere.

[Results and Discussion]

Figure 2A:
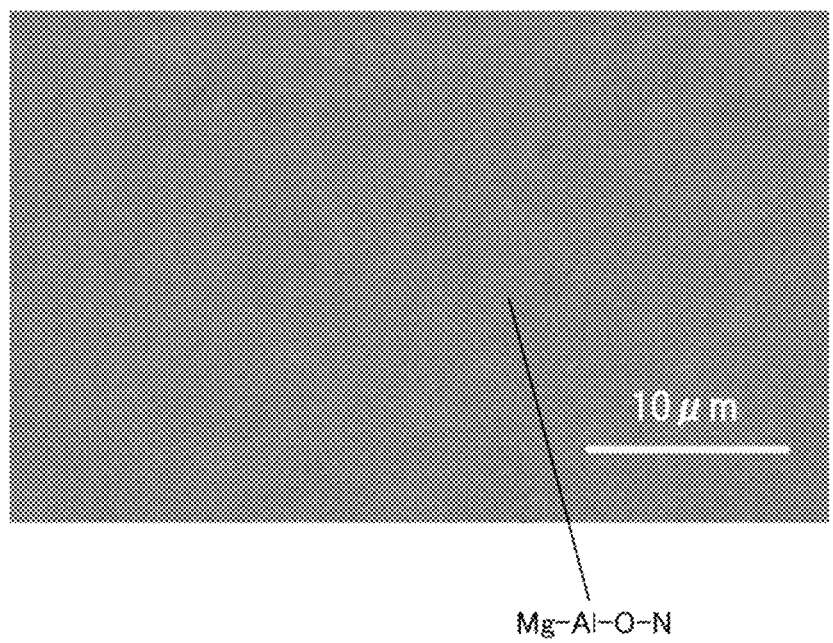
FIGS. 2A and 2B are SEM photographs of a cross section of a first structure in Examples 1 and 15, respectively.
Figure 2B:
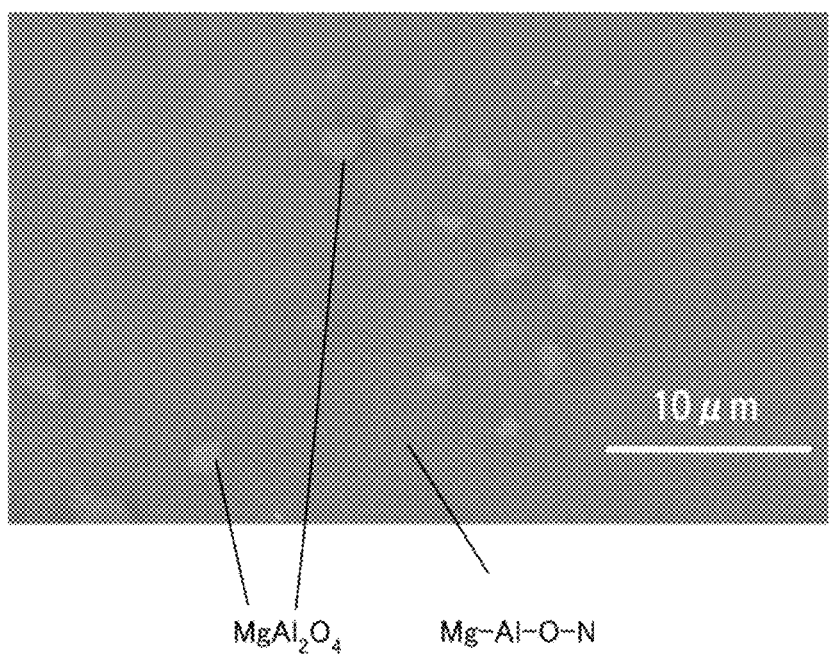
Figure 3A:
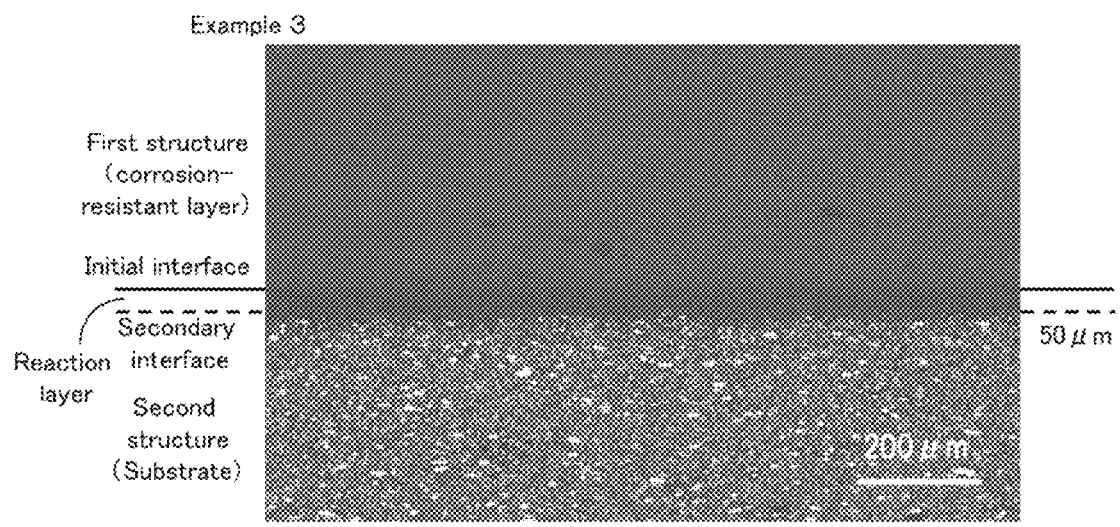
FIGS. 3A and 3B are SEM photographs of a cross section including a reaction layer in Examples 3 and 4, respectively.
Figure 3B:
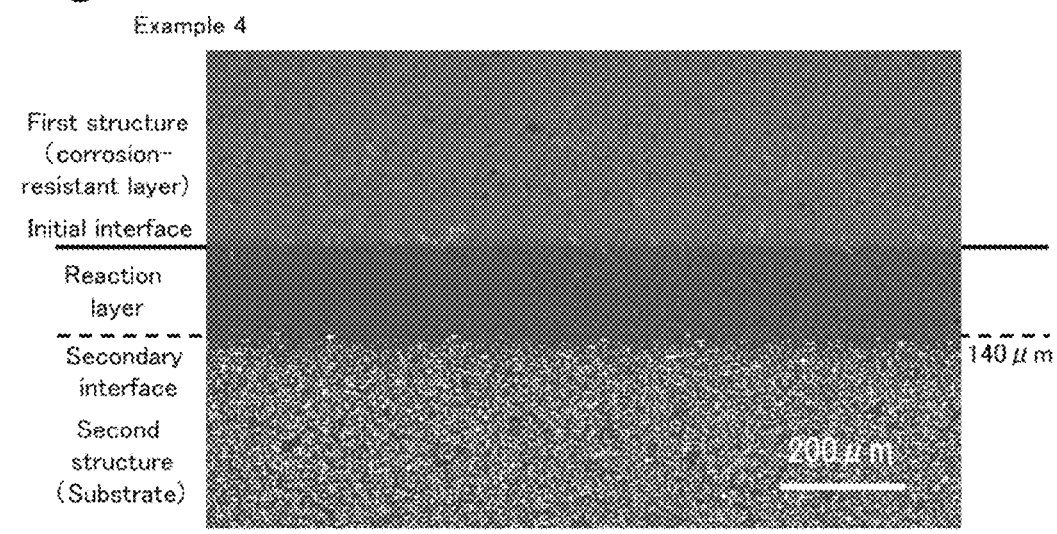
Figure 4:
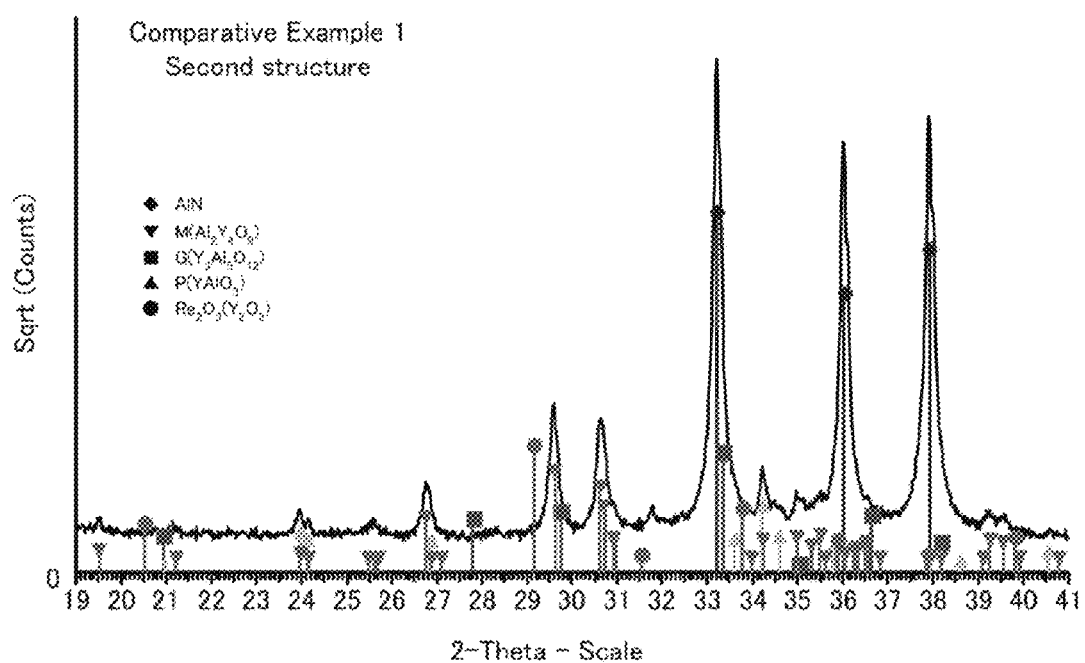
FIG. 4 is an X-ray diffraction measurement result of a second structure in Comparative Example 1.
Figure 5:
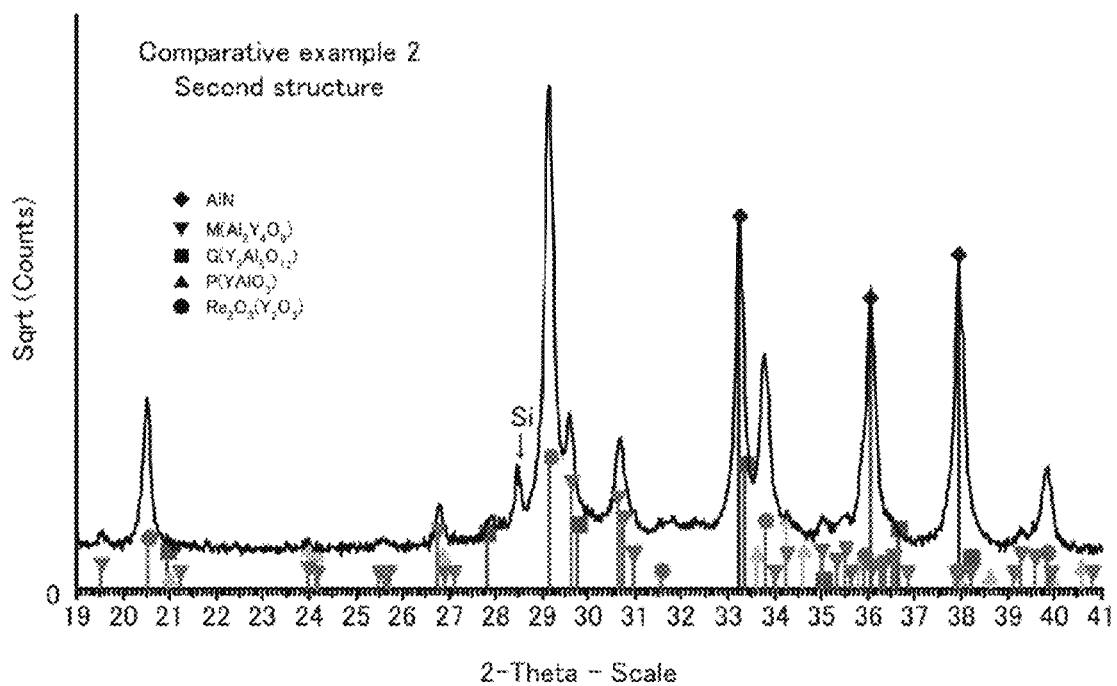
FIG. 5 is an X-ray diffraction measurement result of a second structure in Comparative Example 2.
Figure 6:
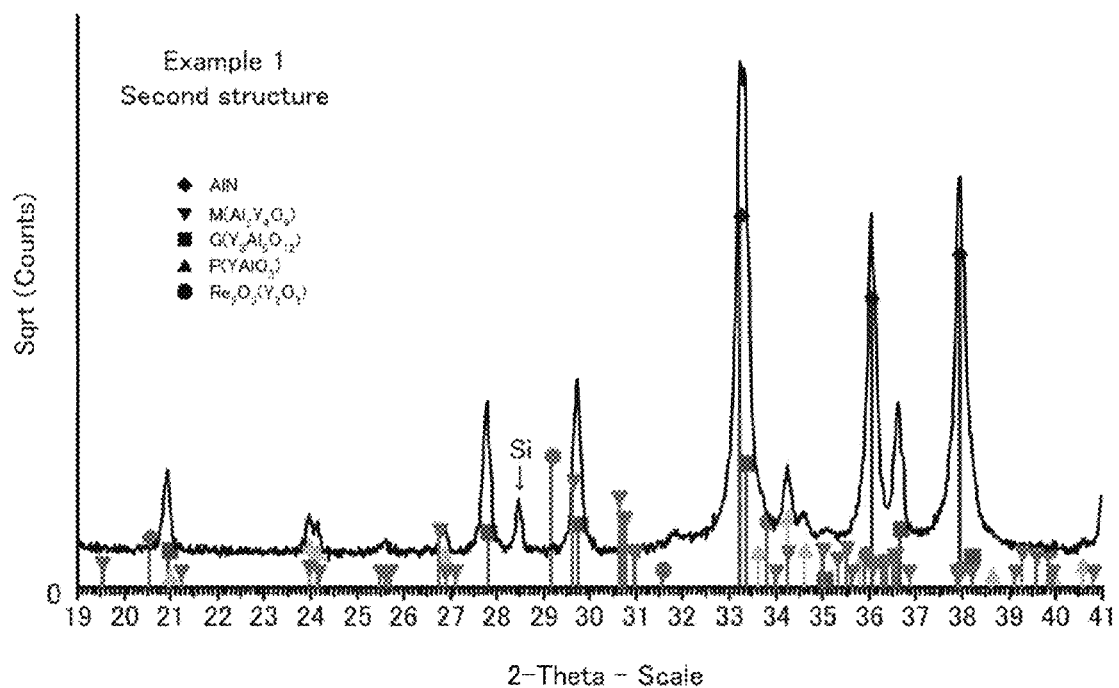
FIG. 6 is an X-ray diffraction measurement result Of a second structure in Example 1.
Figure 7:
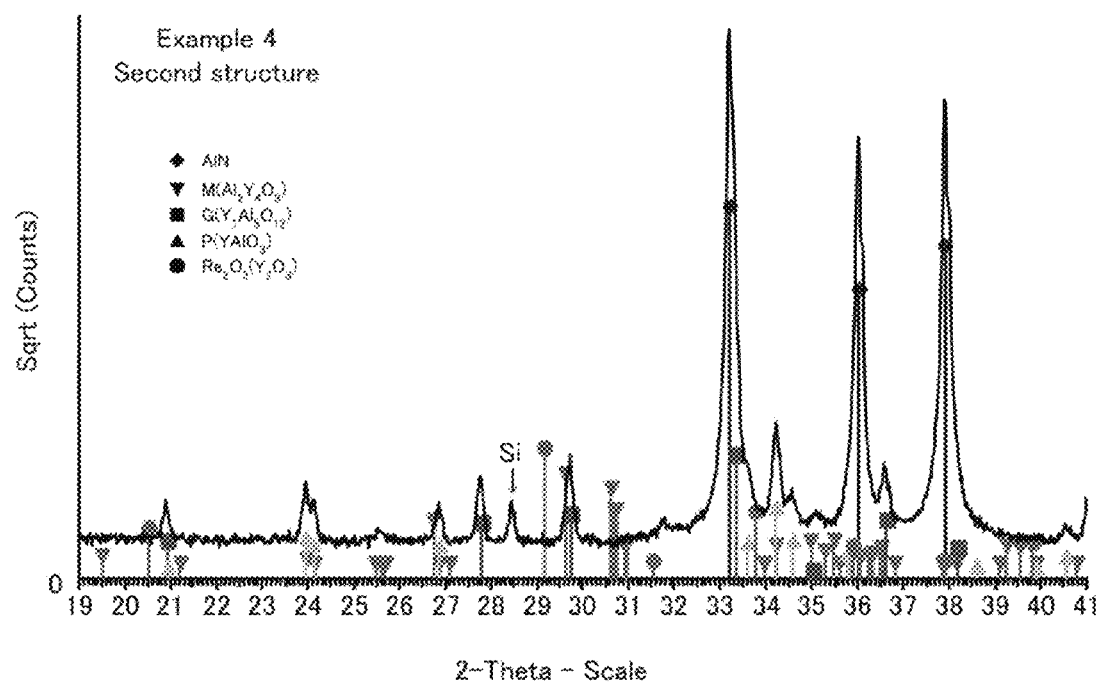
FIG. 7 is an X-ray diffraction measurement result of a second structure in Example 4.
Figure 8:
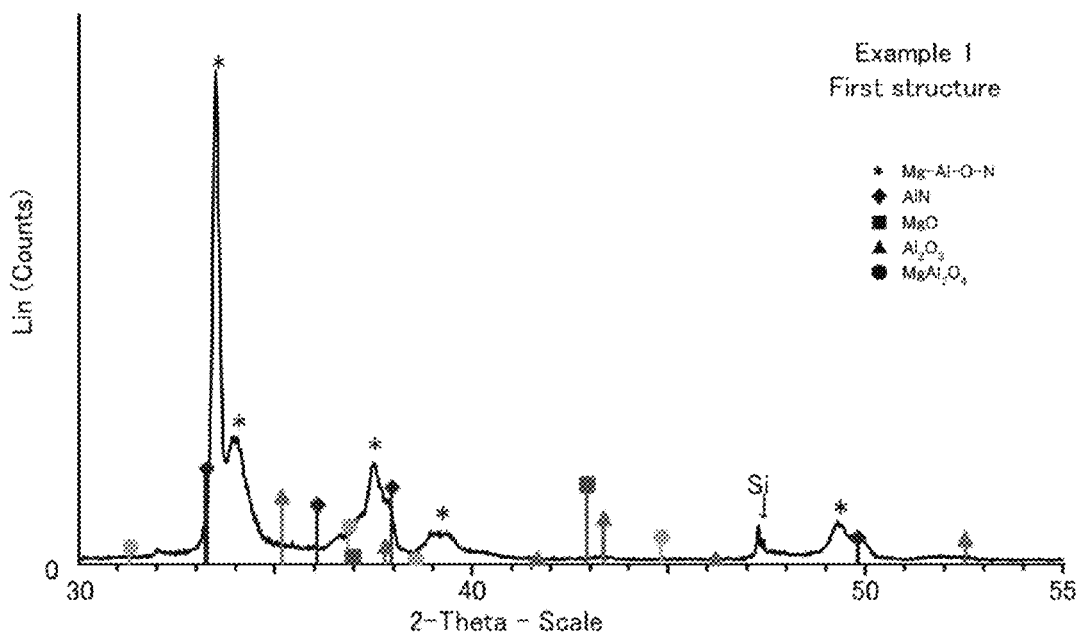
FIG. 8 is an X-ray diffraction measurement result of first structure in Example 1.
Figure 9:
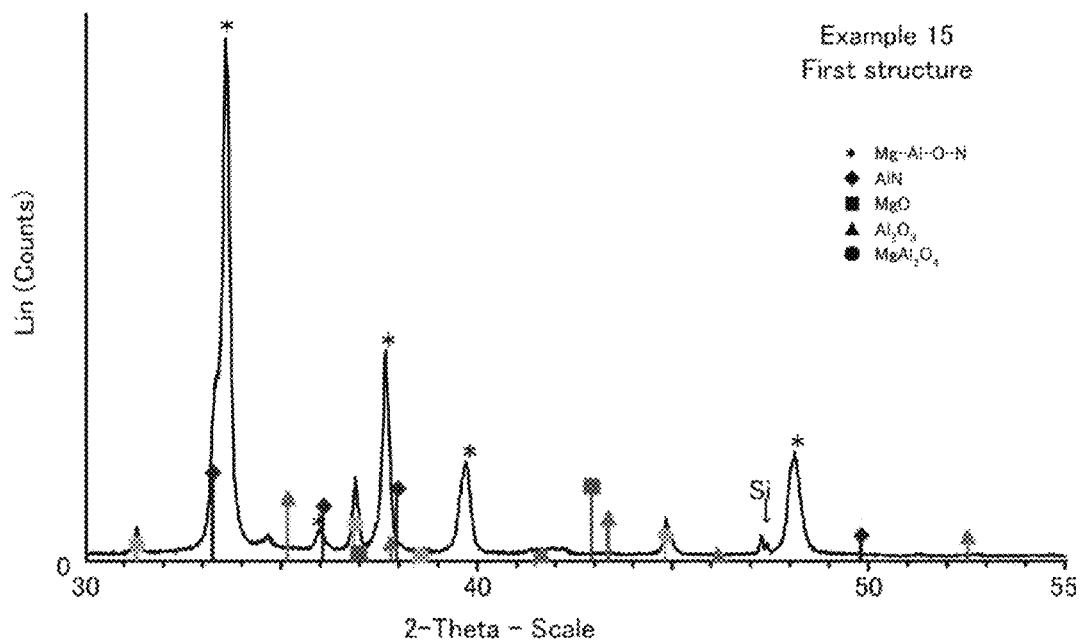
FIG. 9 is an X-ray diffraction measurement result of a first structure in Example 15.

Table 2 summarizes the measurement results. FIGS. 2A and 2B are SEM photographs of a cross section of the first structure in Examples 1 and 15, respectively. FIGS. 3A and 3B are SEM photographs of a cross section including the reaction layer in Examples 3 and 4, respectively. FIGS. 4 to 7 are X-ray diffraction diagrams of the second structure in Comparative Examples 1 and 2 and Examples 1 and 4, respectively. FIGS. 8 and 9 are X-ray diffraction diagrams of the first structure in Examples 1 and 15, respectively. The first structure has the same structure in Examples 1 to 8 and Comparative Examples 1 to 5, in Examples 9 and 10, in Examples 11 and 12, in Examples 13 and 14, and in Examples 15 and 16. As shown in FIGS. 2A and 2B, magnesium-aluminum oxynitride (Mg—Al—O—N) was identified in Example 1, and magnesium-aluminum oxynitride and a small amount of $MgAl_2O_4$ as a subphase were identified in Example 15. As shown in FIGS. 3A and 3B, in the laminated structure as in Examples 3 and 4, the rare-earth aluminum composite oxide of the second structure diffused into the first structure through the initial interface to form the reaction layer mainly composed of aluminum nitride and having a smaller amount of rare-earth aluminum composite oxide than the second structure. It was found that the thickness of the reaction layer varied depending on the forming conditions, such as the composition of the second structure. The X-ray diffraction diagrams showed that all the second structures contained a main phase of aluminum nitride and grain boundary phases of yttrium-aluminum composite oxide (hereinafter also referred to simply as a composite oxide) of at least one of monoclinic, garnet, and perovskite types. FIG. 4 shows that the grain boundary phases in the second structure in Comparative Example 1 were composed of monoclinic-type and perovskite-type composite oxides. The reaction layer in Comparative Example 1 had a large thickness of 365 μm, and cracks were observed on the outer peripheral surface of the laminated structure. FIG. 5 shows that the grain boundary phases in the second structure in Comparative Example 2 were composed of a monoclinic-type composite oxide and a rare-earth oxide ($RE_2O_3$). The reaction layer in Comparative Example 2 had a large thickness of 370 μm, and cracks were observed on the outer peripheral surface of the laminated structure. Thus, it was supposed that the grain boundary phases of the monoclinic-type composite oxide in the second structure easily diffused into magnesium-aluminum oxynitride of the corrosion-resistant layer of the first structure, resulting in a thick reaction layer and easily causing cracking. As illustrated in FIG. 8, the first structure in Example 1 contained a main phase of magnesium-aluminum oxynitride.

TABLE 2

| | Presence of Crack [4] | Result of XRD semi-qualtitative analysis of second structure[1]/% by mass | | | | | Linear thermal expansion coefficient of second structure (ppm/K) | $\Delta CTE^{[3]}$ (ppm/K) | Thickness of reaction layer (μm) |
|---|---|---|---|---|---|---|---|---|---|
| | | AlN | M | G | P | $Re_2O_3^{[2]}$ | | | |
| Comparative example 1 | + | 89.3 | 9.8 | – | 0.9 | – | 5.7 | 0.2 | 365 |
| Comparative example 2 | + | 61.8 | 14.3 | – | – | 23.9 | 6.0 | 0.1 | 370 |
| Example 1 | – | 80.7 | – | 17.7 | 1.6 | – | 5.9 | 0 | 10 |
| Example 2 | – | 80.6 | – | 17.6 | 1.8 | – | 5.9 | 0 | 20 |
| Example 3 | – | 80.7 | – | 17.5 | 1.8 | – | 5.9 | 0 | 50 |
| Comparative example 3 | + | 80.1 | – | 17.9 | 2.0 | – | 5.9 | 0 | 375 |
| Comparative example 4 | + | 80.1 | – | 17.8 | 2.1 | – | 5.9 | 0 | 430 |
| Example 4 | – | 92.8 | – | 4.6 | 2.6 | – | 5.7 | 0.2 | 140 |
| Example 5 | – | 92.6 | – | 4.9 | 2.5 | – | 5.7 | 0.2 | 100 |
| Example 6 | – | 92.9 | – | 4.8 | 2.3 | – | 5.8 | 0.1 | 90 |
| Example 7 | – | 85.4 | – | 12.5 | 2.1 | – | 5.9 | 0 | 50 |
| Example 8 | – | 76.7 | – | 22.1 | 1.2 | – | 6.1 | 0.2 | 50 |
| Comparative example 5 | + | 62.8 | – | 36.5 | 0.7 | – | 6.5 | 0.6 | 55 |
| Example 9 | – | 85.9 | – | 11.9 | 2.2 | – | 5.3 | 0.1 | 20 |
| Example 10 | – | 85.8 | – | 12.1 | 2.1 | – | 5.9 | 0.1 | 45 |
| Example 11 | – | 76.8 | – | 22.3 | 0.9 | – | 6.1 | 0.1 | 15 |

TABLE 2-continued

| | Presence of Crack [4] | Result of XRD semi-qualtitative analysis of second structure[1]/% by mass | | | | | Linear thermal expansion coefficient of second structure (ppm/K) | ΔCTE[3] (ppm/K) | Thickness of reaction layer (μm) |
|---|---|---|---|---|---|---|---|---|---|
| | | AlN | M | G | P | $Re_2O_3$[2] | | | |
| Example 12 | − | 76.9 | − | 22.1 | 1.0 | − | 6.1 | 0.1 | 50 |
| Example 13 | − | 63.8 | − | 35.4 | 0.8 | − | 6.5 | 0 | 10 |
| Example 14 | − | 64.1 | − | 35.1 | 0.8 | − | 6.5 | 0 | 45 |
| Example 15 | − | 63.2 | − | 36.1 | 0.7 | − | 6.5 | 0.3 | 20 |
| Example 16 | − | 63.4 | − | 35.8 | 0.8 | − | 6.5 | 0.3 | 40 |

[1] M, G, and P were identified from the XRD measurement of the second structure (lower portion) and were crystal types of rare-earth aluminum composite oxides other than AlN. M: monoclinic-type, G: garnet-type, P: perovskite-type
[2] Re2O3 refers to the remaider of rare-earth oxides.
[3] ΔCTE denotes a difference in linear thermal expansion coefficient between the first structure and the second structure.
[4] +: Cracks were observed, −: Cracks were not observed In Examples 1 to 3, the grain boundary phases in the second structure were composed of garnet-type and perovskite-type composite oxides, and the reaction layer had a small thickness in the range of 10 to 50 μm. In Examples 1 to 3, the difference in linear thermal expansion coefficient between the first structure and the second structure was small, in the range of 0 to 0.1, and no crack was observed on the outer peripheral surface of the laminated structure. In Comparative Examples 3 and 4, the grain boundary phases in the second structure were composed of garnet-type and perovskite-type composite oxides. Although the difference in linear thermal expansion coefficient was small, in the range of 0 to 0.1, the sintering temperature was high, and the reaction layer had a large thickness of 375 or 430 μm. In Comparative Examples 3 and 4, therefore, cracks were observed on the outer peripheral surface of the laminated structure.

In Examples 4 to 8, the grain boundary phases in the second structure were composed of garnet-type and perovskite-type composite oxides, and the reaction layer had a relatively small thickness in the range of 50 to 140 μm. In Examples 4 to 8, the difference in linear thermal expansion coefficient was small, in the range of 0 to 0.2, and no crack was observed on the outer peripheral surface of the laminated structure. In Examples 4 to 6, a high ratio of the perovskite-type grain boundary phases to the garnet-type grain boundary phases resulted in a slightly large thickness of the reaction layer. In Comparative Example 5, the grain boundary phases in the second structure were composed of garnet-type and perovskite-type composite oxides. Although the reaction layer had a small thickness of 55 μm, the difference in linear thermal expansion coefficient was as large as 0.6. In Comparative Example 5, therefore, cracks were observed on the outer peripheral surface of the laminated structure.

In Examples 9 to 16, the grain boundary phases in the second structure contained a main phase of garnet-type and perovskite-type composite oxides, and the reaction layer had a small thickness in the range of 20 to 50 μm. In Examples 9 to 16, the difference in linear thermal expansion coefficient was small, in the range of 0 to 0.3, and no crack was observed on the outer peripheral surface of the laminated structure. In Examples 11 to 16, Mg of the first structure was larger in quantity than the other components, had a high linear thermal expansion coefficient in the range of 6.2 to 6.8 ppm/K, and had high corrosion resistance. In Examples 11 to 16, the grain boundary phases in the second structure contained a large amount of garnet-type composite oxide and a small amount of perovskite-type composite oxide. Thus, in Examples 11 to 16, since the thickness of the reaction layer was further reduced, and the difference in linear thermal expansion coefficient was small, it was supposed that the satisfactory laminated structure without cracks on the outer peripheral surface was obtained. As illustrated in FIG. 9, the first structure in Example 15 contained a main phase of magnesium-aluminum oxynitride and a subphase of $MgAl_2O_4$.

Thus, in order to at least reduce the thickness of the reaction layer, it is probably effective to contain no monoclinic-type composite oxide in the grain boundary phases in the second structure and increase the amount of garnet-type composite oxide relative to the amount of perovskite type composite oxide. In order to increase the amount of garnet-type composite oxide relative to the amount of perovskite-type composite oxide, it is desirable that the ratio (R/(R+A)) of the number of moles R of rare-earth oxide to the total number of moles (R+A) of rare-earth oxide and aluminum oxide of the raw material composition be 0.70 or less. Thus, it was found that the occurrence of cracks in the laminated structure could be reduced when the grain boundary phases in the second structure were composed of garnet-type and perovskite-type composite oxides, the reaction layer had a thickness of 200 μm or less, and the difference in linear thermal expansion coefficient between the first structure and the second structure was 0.3 or less. It was also found that although the thickness of a second structure as a substrate layer is generally greater than the thickness of a first structure as a corrosion-resistant layer the present invention can reduce the occurrence of cracks in a laminated structure irrespective of the thickness of the second structure.

The present application claims priority on the basis of the Japanese. Patent Application No. 2012-203586 filed on Sep. 14, 2012, the entire contents of which are incorporated herein by reference.

What is claimed is:
1. A laminated structure, comprising:
a first structure containing a main phase of magnesium-aluminum oxynitride;
a second structure containing a main phase of aluminum nitride and grain boundary phases of a rare-earth aluminum composite oxide having a garnet-type crystal structure; and
a reaction layer formed between the first structure and the second structure, the reaction layer being an aluminum nitride layer containing a smaller amount of grain boundary phases of the rare-earth aluminum composite oxide than the second structure, wherein the reaction layer has a thickness of 150 μm or less, and the difference in linear thermal expansion coefficient between the first structure and the second structure is 0.3 ppm/K or less.

2. The laminated structure according to claim 1, wherein the reaction layer has a thickness of 100 μm or less.

3. The laminated structure according to claim 1, wherein the second structure further contains a rare earth aluminum composite oxide having a perovskite-type crystal structure.

4. The laminated structure according to claim 1, wherein the first structure has a magnesium-aluminum oxynitride phase serving as a main phase, wherein an XRD peak of the magnesium-aluminum oxynitride phase measured with CuKα radiation appears at least 2θ=the 47 to 50°.

5. The laminated structure according to claim 1, wherein the first structure has a raw material composition of 50 mol % or more and 95 mol % or less aluminum nitride, 1 mol % or more and 40 mol % or less magnesium oxide, and 1 mol % or more and 25 mol % or less aluminum oxide.

6. The laminated structure according to claim 1, wherein the second structure has a raw material composition of 84 mol % or more and 99 mol % or less aluminum nitride, 0.5 mol % or more and 15 mol % or less aluminum oxide, and 0.5 mol % or more and 10 mol % or less rare-earth oxide.

7. The laminated structure according to claim 1, wherein the rare-earth element of the rare-earth aluminum composite oxide is at least one of Y, Dy, Ho, Er, Tm, Yb, and Lu.

8. A member for a semiconductor manufacturing apparatus, having the laminated structure according to claim 1.

9. A method for producing a laminated structure comprising a first structure containing a main phase of magnesium-aluminum oxynitride, a second structure containing a main phase of aluminum nitride and grain boundary phases of a rare-earth aluminum composite oxide having a garnet-type crystal structure, and a reaction layer formed between the first structure and the second structure, the reaction layer being an aluminum nitride layer containing a smaller amount of grain boundary phases of the rare earth aluminum composite oxide than the second structure, wherein the reaction layer has a thickness of 150 μm or less, and the difference in linear thermal expansion coefficient between the first structure and the second structure is 0.3 ppm/K or less, wherein the method comprises a forming process of the second structure including applying a raw material powder of the second structure containing a main phase of aluminum nitride and grain boundary phases of a rare-earth aluminum composite oxide having a garnet-type crystal structure to the first structure, which is a sintered body containing magnesium-aluminum-oxynitride, to form laminated product and the laminated product is sintered by hot-pressing of the raw material powder to form the second structure.

10. The method for producing a laminated structure according to claim 9, wherein the raw material powder of the second structure has a composition of 84 mol % or more and 99 mol % or less aluminum nitride, 0.5 mol % or more and 15 mol % or less aluminum oxide, and 0.5 mol % or more and 10 mol % or less rare-earth oxide in the forming process of the second structure.

11. The method for producing a laminated structure according to claim 9, wherein the rare-earth element includes at least one of Y, Dy, Ho, Er, Tm, Yb, and Lu.

12. The method for producing a laminated structure according to claim 9, wherein the molar ratio of the rare-earth oxide to the total amount of rare-earth oxide and aluminum oxide in the raw material powder of the second structure is 0.7 or less.

13. The method for producing a laminated structure according to claim 9, wherein the hot pressing temperature of the forming process of the second structure is more than 1650° C. and less than 1850° C.

14. The method for producing a laminated structure according to claim 9, wherein the first structure has a raw material composition of 50 mol % or more and 95 mol % or less aluminum nitride, 1 mol % or more and 40 mol % or less magnesium oxide, and 1 mol % or more and 25 mol % or less aluminum oxide.

15. The method for producing a laminated structure according to claim 9, wherein the first structure is hot-pressed at a temperature of 1650° C. or more and 2000° C. or less.

16. The method for producing a laminated structure according to claim 9, further comprising a forming process of the first structure including shaping a raw material powder of the first structure, which is to become magnesium-aluminum oxynitride, and a hot-pressing process of the raw material powder to form the first structure.

* * * * *